US010221061B2

(12) United States Patent
Warashina

(10) Patent No.: US 10,221,061 B2
(45) Date of Patent: Mar. 5, 2019

(54) OPTICAL MODULE

(71) Applicant: HAMAMATSU PHOTONICS K.K., Hamamatsu-shi, Shizuoka (JP)

(72) Inventor: Yoshihisa Warashina, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 209 days.

(21) Appl. No.: 15/025,691

(22) PCT Filed: Sep. 8, 2014

(86) PCT No.: PCT/JP2014/073712
§ 371 (c)(1),
(2) Date: Mar. 30, 2016

(87) PCT Pub. No.: WO2015/049958
PCT Pub. Date: Apr. 9, 2015

(65) Prior Publication Data
US 2016/0244320 A1 Aug. 25, 2016

(30) Foreign Application Priority Data

Oct. 1, 2013 (JP) ................. 2013-206686

(51) Int. Cl.
G02B 26/00 (2006.01)
B81B 3/00 (2006.01)
(Continued)

(52) U.S. Cl.
CPC .............. B81B 3/0051 (2013.01); *G01J 3/26* (2013.01); *G02B 6/29395* (2013.01);
(Continued)

(58) Field of Classification Search
CPC ..... G01J 3/26; G02B 26/001; G02B 26/0841; G02B 5/28; G02B 26/105; B81B 3/0051;
(Continued)

(56) References Cited

U.S. PATENT DOCUMENTS 7,551,287 B2 * 6/2009 Zribi ........................ A45D 1/04
356/454
8,105,496 B2 * 1/2012 Miles ..................... B82Y 20/00
216/2
(Continued)

FOREIGN PATENT DOCUMENTS

CN 2663953 12/2004
CN 102834764 12/2012
(Continued)

OTHER PUBLICATIONS

Liu Junbiao, et al., "Precision stage technology in micro-nano fabrication IV.Elastic deformation transmission type of micro-displacement mechanism", Beijing University of Technology Publishing Firm, Dec. 31, 2004 (partial English-language translation attached).

(Continued)

*Primary Examiner* — William R Alexander
*Assistant Examiner* — Ephrem Z Mebrahtu
(74) *Attorney, Agent, or Firm* — Drinker Biddle & Reath LLP

(57) ABSTRACT

An optical module includes a semiconductor substrate, an electrostatic actuator including a fixed portion fixed to the semiconductor substrate and a movable portion moved with respect to the fixed portion by an electrostatic force generated between the movable portion and the fixed portion, a first spring portion connected to the movable portion and having a first spring constant K1, a second spring portion connected between the first spring portion and the semiconductor substrate and having a second spring constant K2 greater than the first spring constant K1, and a movable mirror which is an optical component connected to a connection portion between the first spring portion and the second spring portion.

8 Claims, 13 Drawing Sheets

(51) Int. Cl.
*H02N 1/00* (2006.01)
*G01J 3/26* (2006.01)
*G02B 6/293* (2006.01)
*G02B 26/08* (2006.01)

(52) U.S. Cl.
CPC ........... *G02B 26/001* (2013.01); *H02N 1/008* (2013.01); *B81B 2201/038* (2013.01); *B81B 2201/042* (2013.01); *B81B 2203/0163* (2013.01); *G02B 26/0841* (2013.01)

(58) Field of Classification Search
CPC ........ B81B 2201/038; B81B 2201/042; B81B 2203/0163
See application file for complete search history.

(56) References Cited

U.S. PATENT DOCUMENTS

| | | | |
|---|---|---|---|
| 2008/0158568 A1* | 7/2008 | Claydon | G01J 3/02 356/454 |
| 2009/0153844 A1 | 6/2009 | Peter et al. | |
| 2010/0188728 A1 | 7/2010 | Warashina et al. | |
| 2010/0220331 A1 | 9/2010 | Zribi et al. | |
| 2011/0063773 A1* | 3/2011 | Ikehashi | H01G 5/16 361/277 |
| 2011/0222067 A1 | 9/2011 | Saadany et al. | |
| 2015/0153563 A1* | 6/2015 | Kamal | G02B 26/001 372/20 |

FOREIGN PATENT DOCUMENTS

| | | |
|---|---|---|
| JP | H02-40481 A | 2/1990 |
| JP | 2008-044068 | 2/2008 |
| JP | 2008-256837 A | 10/2008 |
| JP | 2013-009447 | 1/2013 |
| JP | 2013-522600 A | 6/2013 |
| WO | WO 2008/123525 | 10/2008 |

OTHER PUBLICATIONS

International Preliminary Report on Patentability dated Apr. 14, 2016 for PCT/JP2014/073712.

* cited by examiner

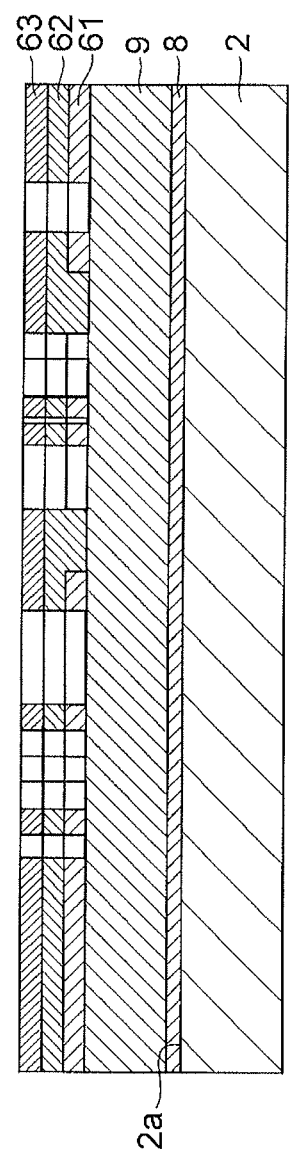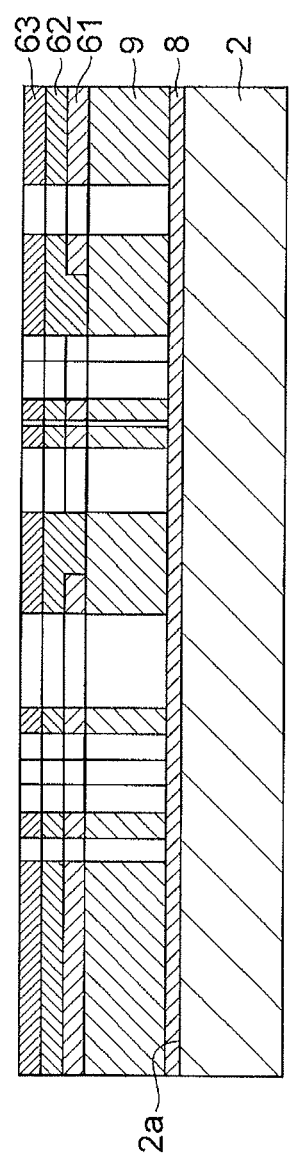
Fig.5

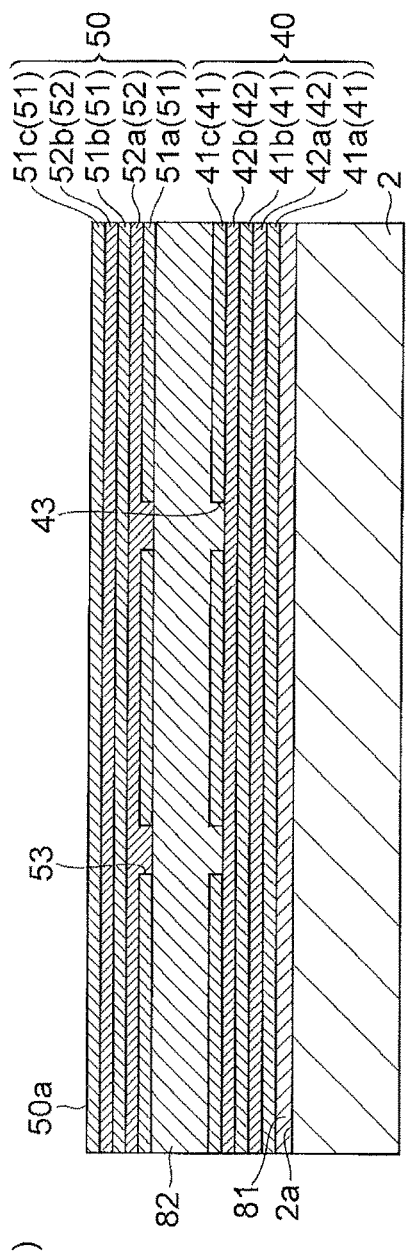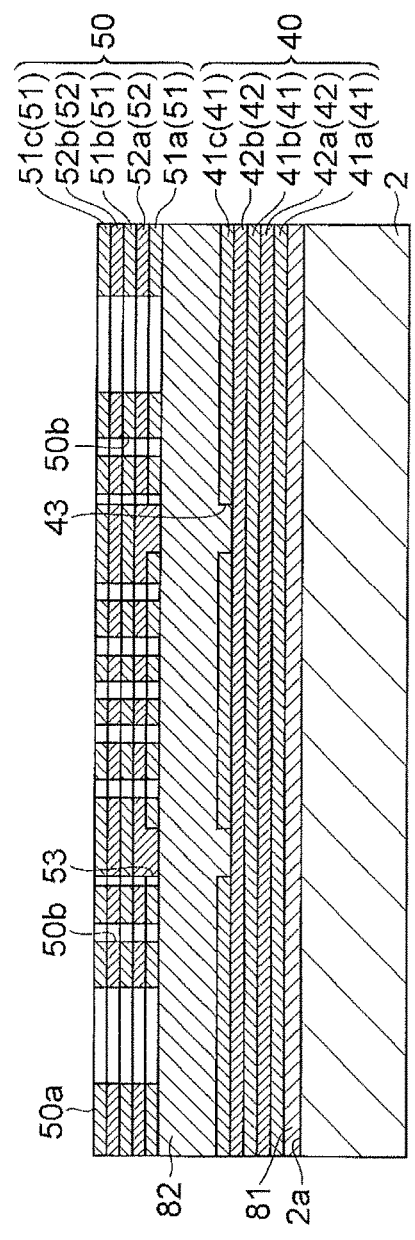
Fig.13

OPTICAL MODULE

TECHNICAL FIELD

The present invention relates to an optical module in which MEMS (Micro Electro Mechanical Systems) technology is used.

BACKGROUND ART

As an optical module in which MEMS technology is used, for example, there is an optical module including an electrostatic actuator and a Fabry-Perot interference filter. In the Fabry-Perot interference filter, a distance between a pair of mirrors is changed by the electrostatic actuator, and light having a wavelength according to the distance is transmitted. Therefore, to increase the wavelength resolution of the Fabry-Perot interference filter, it is necessary to stably move the mirror using the electrostatic actuator with high precision.

Therefore, technology for controlling the operation of the mirror by detecting a change in electrostatic capacitance of the electrostatic actuator has been proposed (for example, see Patent Literature 1). According to this technology, it is possible to appropriately operate a mirror regardless of the instability of an applied voltage, a change in an ambient temperature, and the like.

CITATION LIST

Patent Literature

Patent Literature 1: U.S. Patent Application Publication No. 2011/0222067

SUMMARY OF INVENTION

Technical Problem

However, it is not easy to appropriately detect a small change in the capacitance of the electrostatic actuator as the wavelength resolution of the Fabry-Perot interference filter increases. Thus, it may be impossible to stably operate the mirror with high precision using the electrostatic actuator even according to the technology disclosed in Patent Literature 1.

Therefore, an object of the present invention is to provide an optical module capable of stably operating an optical component with high precision using an electrostatic actuator.

Solution to Problem

An optical module according to the present invention includes a semiconductor substrate; an electrostatic actuator including a fixed portion fixed to the semiconductor substrate and a movable portion moved with respect to the fixed portion by an electrostatic force generated between the movable portion and the fixed portion; a first spring portion connected to the movable portion and having a first spring constant; a second spring portion connected between the first spring portion and the semiconductor substrate and having a second spring constant greater than the first spring constant; and an optical component connected to a connection portion between the first spring portion and the second spring portion.

In the optical module, the movable portion of the electrostatic actuator, is connected to the first spring portion having the first spring constant, and the optical component is connected to the connection portion between the first spring portion and the second spring portion. Further, the first spring constant is set to be smaller than the second spring constant. Thus, a movement distance of the optical component is small compared to a movement distance of the movable portion in the electrostatic actuator moved by the electrostatic force. Therefore, it is possible to stably operate the optical component with high precision using the electrostatic actuator by controlling the movement distance of the optical component through control of the movement distance of the movable portion.

Advantageous Effects of Invention

According to the present invention, it is possible to provide an optical module capable of stably operating an optical component with high precision using an electrostatic actuator.

BRIEF DESCRIPTION OF DRAWINGS

FIG. 5 includes (a), (b) cross-sectional views illustrating a process of manufacturing the optical module of FIG. 1.

FIG. 13 includes (a), (b) cross-sectional views illustrating a process of manufacturing the optical module of FIG. 8.

DESCRIPTION OF EMBODIMENTS

Hereinafter, embodiments of an optical module according to the present invention will be described in detail with reference to the drawings. In the respective drawings, the same or equivalent parts are denoted by the same reference signs, and redundant description thereof will be omitted.

First Embodiment

Figure 1:
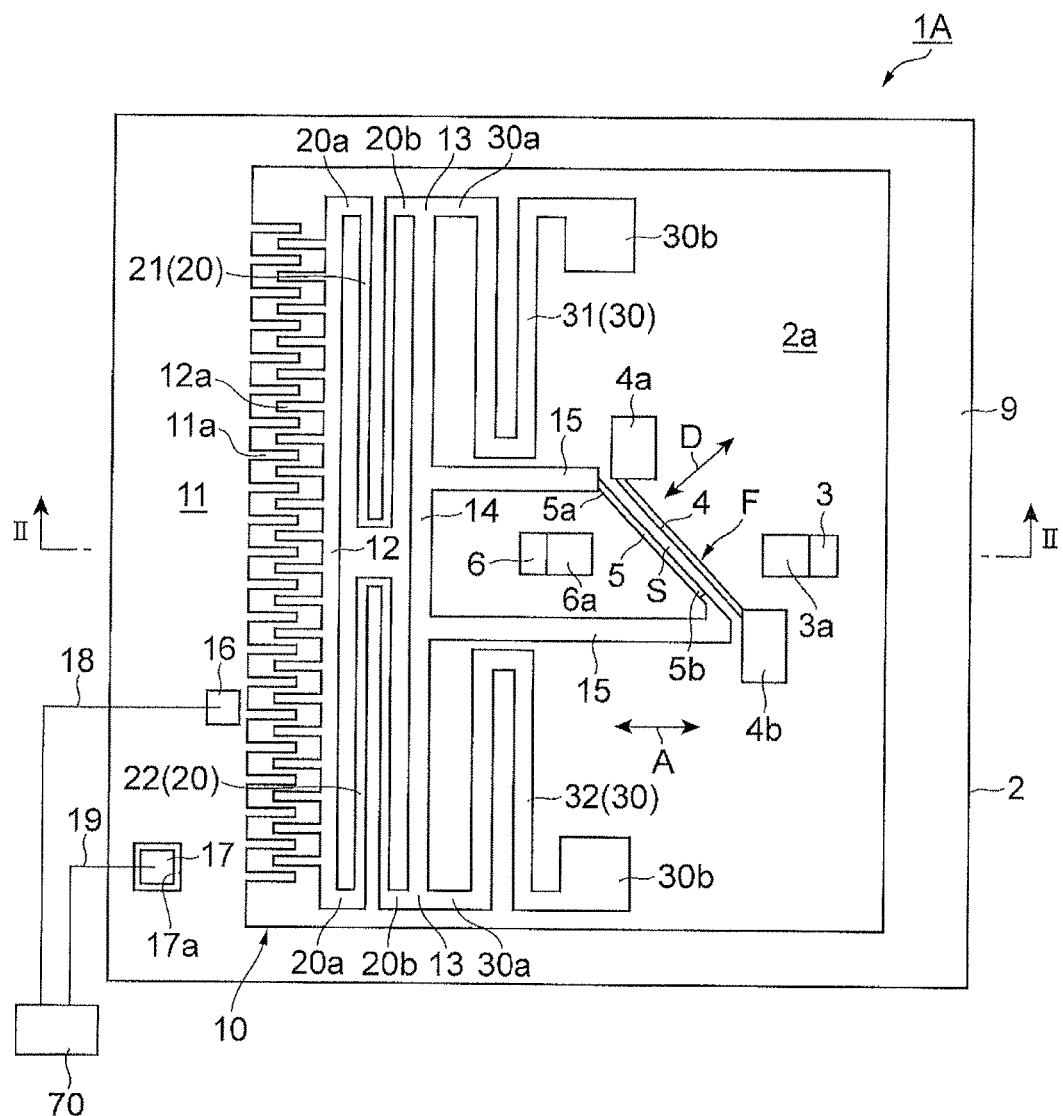
FIG. 1 is a plan view of an optical module of a first embodiment.

FIG. 1 is a plan view of an optical module of a first embodiment. Further, FIG. 2 is a cross-sectional view taken along line II-II of the optical module of FIG. 1.

Figure 2:
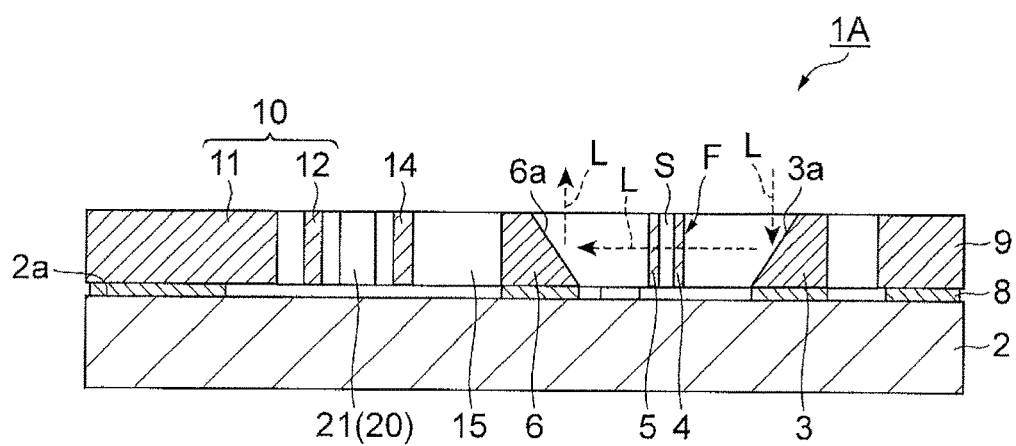
FIG. 2 is a cross-sectional view taken along line II-II of the optical module of FIG. 1.

As illustrated in FIG. 1 and FIG. 2, an optical module 1A includes a semiconductor substrate 2. An input mirror 3, a Fabry-Perot interference filter F, an output mirror 6, an electrostatic actuator 10, a first spring portion 20, and a second spring portion 30 are provided on the semiconductor substrate 2. The Fabry-Perot interference filter F has a fixed mirror 4 and a movable mirror (an optical component) 5 arranged opposite each other through a gap S. The drive of the electrostatic actuator 10 is controlled by a control unit 70.

The optical module 1A is, for example, a MEMS device in which an SOT (Silicon On Insulator) substrate is manufactured as a starting material. In the optical module 1A, each component on the semiconductor substrate 2 is formed by etching a semiconductor layer 9 provided on the semiconductor substrate 2 via an insulating layer 8. In the first embodiment, the semiconductor substrate 2 is made of silicon (Si) and formed in a rectangular plate shape. Further, the insulating layer 8 is made of silicon oxide ($SiO_2$), and the semiconductor layer 9 is made of silicon (Si).

The input mirror 3 is constituted of a part of the semiconductor layer 9 and is fixed to a surface 2a of the semiconductor substrate 2 via the insulating layer 8. The input mirror 3 has a mirror surface 3a inclined 45° with respect to the surface 2a of the semiconductor substrate 2. The mirror surface 3a reflects measurement target light L incident in a direction vertical to the surface 2a of the semiconductor substrate 2 to a side of the Fabry-Perot interference filter F.

The output mirror 6 is constituted of a part of the semiconductor layer 9 and is fixed to the surface 2a of the semiconductor substrate 2 via the insulating layer 8. The output mirror 6 is arranged opposite the input mirror 3 through the Fabry-Perot interference filter F in a drive direction A of the electrostatic actuator 10. The output mirror 6 has a mirror surface 6a inclined 45° with respect to the surface 2a of the semiconductor substrate 2. The mirror surface 6a reflects the measurement target light L transmitted through the Fabry-Perot interference filter F in a direction vertical to the surface 2a of the semiconductor substrate 2.

The fixed mirror 4 of the Fabry-Perot interference filter F is constituted of a part of the semiconductor layer 9 and is in a state of floating above the surface 2a of the semiconductor substrate 2 by removing the insulating layer 8 immediately below the fixed mirror. Both ends of the fixed mirror 4 are fixed to support pillars 4a and 4b as in a both-end supported beam state. The support pillars 4a and 4b are constituted of parts of the semiconductor layer 9 and are fixed to the surface 2a of the semiconductor substrate 2 via the insulating layer 8.

The movable mirror 5 of the Fabry-Perot interference filter F is constituted of a part of the semiconductor layer 9 and is in a state of floating above the surface 2a of the semiconductor substrate 2 by removing the insulating layer 8 immediately below the movable mirror. Both ends 5a and 5b of the movable mirror 5 are connected to a connection portion 13 between the first spring portion 20 and the second spring portion 30 via support portions 14 and 15, and are movable in the drive direction A of the electrostatic actuator 10.

An opposing direction D of the fixed mirror 4 and the movable mirror 5 is inclined with respect to the drive direction A of the electrostatic actuator 10. The fixed mirror 4 and the movable mirror 5 transmit light having a wavelength according to a distance between the fixed mirror 4 and the movable mirror 5 among the measurement target light L incident from a side of the input mirror 3 and emit the light to a side of the output mirror 6 in the drive direction A. Here, although the fixed mirror 4 is arranged on the side of the input mirror 3 and the movable mirror 5 is arranged on the side of the output mirror 6 in the first embodiment, the arrangements of the fixed mirror 4 and the movable mirror 5 may be reversed.

The fixed mirror 4 and the movable mirror 5 are configured by two silicon layers. This is because it is possible to implement a Bragg mirror having sufficiently high reflectance even in two silicon layers because a refractive index of silicon is 3.5, a refractive index of air is 1, and a refractive index difference between these is large. Here, the fixed mirror 4 and the movable mirror 5 may be obtained by alternately laminating a plurality of silicon layers and a plurality of air layers. Even in this case, it is possible to precisely and simply form the fixed mirror 4 and the movable mirror 5 using the same photomask and the same etching process as those of the electrostatic actuator 10, the first spring portion 20, the second spring portion 30, and the like.

The electrostatic actuator 10 is constituted of a part of the semiconductor layer 9. The electrostatic actuator 10 has a fixed portion 11 and a movable portion 12. The fixed portion 11 is fixed to the surface 2a of the semiconductor substrate 2 via the insulating layer 8. The movable portion 12 is in a state of floating above the surface 2a of the semiconductor substrate 2 by removing the insulating layer 8 immediately below the movable portion, and is moved with respect to the fixed portion 11 in the drive direction A by an electrostatic force generated between the movable portion and the fixed portion 11.

The fixed portion 11 is a portion positioned on the side of the output mirror 6 for the Fabry-Perot interference filter F in the semiconductor layer 9 formed in a rectangular frame shape along an outer edge of the semiconductor substrate 2. The fixed portion 11 extends in a direction parallel to the surface 2a of the semiconductor substrate 2 and vertical to the drive direction A. A comb portion 11a having a plurality of comb teeth arranged in the direction parallel to the surface 2a of the semiconductor substrate 2 and vertical to the drive direction A is formed in a side surface of the fixed portion 11 opposite to the movable portion 12 in the drive direction A. The comb portion 11a is in a state of floating above the surface 2a of the semiconductor substrate 2 by removing the insulating layer 8 immediately below the comb portion.

The movable portion 12 is positioned between the fixed portion 11 and the output mirror 6. The movable portion 12 extends in the direction parallel to the surface 2a of the semiconductor substrate 2 and vertical to the drive direction A. A comb portion 12a having a plurality of comb teeth arranged in the direction parallel to the surface 2a of the semiconductor substrate 2 and vertical to the drive direction A is formed in a side surface of the movable portion 12 opposite to the fixed portion 11 in the drive direction A. The fixed portion 1 and the movable portion 12 are configured so that respective comb teeth of the comb portion 11a and respective comb teeth of the comb portion 12a are alternately arranged.

The first spring portion 20 is connected to the movable portion 12 of the electrostatic actuator 10. The first spring portion 20 is constituted of a part of the semiconductor layer 9 and is in a state of floating above the surface 2a of the semiconductor substrate 2 by removing the insulating layer 8 immediately below the first spring portion. The first spring portion 20 includes a pair of first springs 21 and 22 provided in parallel. Each of the first springs 21 and 22 is formed in a zigzag shape and is extendable in the drive direction A.

One end of each of the first springs 21 and 22 is connected to each of the both ends of the movable portion 12, and the other end of each of the first springs 21 and 22 is connected to the second spring portion 30. Thereby, the first spring portion 20 is configured to have one end 20a to which the movable portion 12 is fixed (that is, the one end of each of the first springs 21 and 22) and the other end 20b serving as the connection portion 13 with the second spring portion 30 (that is, the other end of each of the first springs 21 and 22). The first spring portion 20 configured as described above has a first spring constant K1. The first spring constant K1 is obtained by combining spring constants of the pair of first springs 21 and 22.

The second spring portion 30 is connected between the first spring portion 20 and the semiconductor substrate 2. The second spring portion 30 is constituted of a part of the semiconductor layer 9 and is in a state of floating above the surface 2a of the semiconductor substrate 2 by removing the insulating layer 8 immediately below the second spring portion. The second spring portion 30 includes a pair of second springs 31 and 32 provided in parallel. Each of the second springs 31 and 32 is formed in a zigzag shape and is extendable in the drive direction A.

One end of each of the second springs 31 and 32 is connected to the other end of each of the first springs 21 and 22 of the first spring portion 20, and the other end of each of the second springs 31 and 32 is fixed to the surface 2a of the semiconductor substrate 2 via the insulating layer 8. Thereby, the second spring portion 30 is configured to have one end 30a serving as the connection portion 13 with the first spring portion 20 (that is, one end of each of the second springs 31 and 32) and the other end 30b fixed to the semiconductor substrate 2 (that is, the other end of each of the second springs 31 and 32). The second spring portion 30 configured as described above has a second spring constant K2 greater than the first spring constant K1 of the first spring portion 20. The second spring constant K2 is obtained by combining spring constants of the pair of second springs 31 and 32.

As an integrated spring, the first spring portion 20 and the second spring portion 30 are balanced with an electrostatic force of the electrostatic actuator 10. A support portion 14 is connected between the connection portions 13 between the first spring portion 20 and the second spring portion 30, and a pair of support portions 15 extending to the side of the Fabry-Perot interference filter F in the drive direction A are connected to the support portion 14. The support portions 14 and 15 are constituted of a part of the semiconductor layer 9 and are in a state of floating above the surface 2a of the semiconductor substrate 2 by removing the insulating layer 8 immediately below the support portions. Each of the both ends 5a and 5b of the movable mirror 5 is connected to an end of each of the support portions 15. The movable portion 12, the first spring portion 20, the second spring portion 30, the support portions 14 and 15, and the movable mirror 5 are integrally formed with the semiconductor substrate 2, and supported on the semiconductor substrate 2 as in a cantilevered beam state in which the other end 30b of the second spring portion 30 serves as a fixed end.

Magnitudes of the first spring constant K1 and the second spring constant K2 can be adjusted according to a width, a length, a thickness, the number of springs, and the like, of the semiconductor layer 9 constituting the first spring portion 20 and the second spring portion 30. Because these can be determined by only a photomask design, it is possible to precisely and simply adjust the spring constant.

Because the spring constant of a spring by a beam is proportional to the cube of the width of the beam, it is possible to prepare a spring having a spring constant increased by 1000 times by increasing the width 10 times. For example, when the width of a beam constituting the first springs 21 and 22 of the first spring portion 20 is set to 5 μm and the width of a beam constituting the second springs 31 and 32 of the second spring portion 30 is set to 40 μm, the second spring constant K2 becomes about 1000 times$\approx 2\times (40/5)^3$ the first spring constant K1. Further, the spring constant of a spring by a beam changes in proportion to a reciprocal of the cube of the length of the beam. For example, when the length of the second spring portion 30 is ⅔ of the length of the first spring portion 20, the second spring constant K2 is about 3.3 times$\approx (3/2)^3$ the first spring constant K1.

Here, the first spring portion 20 is not limited to the case in which a pair of first springs 21 and 22 are included, but may be constituted of one spring or three or more springs. Likewise, the second spring portion 30 is not limited to the case in which a pair of second springs 31 and 32 are included, but may be constituted of one spring or three or more springs. Further, the first spring portion 20 and the second spring portion 30 may be formed of different materials from each other.

The control unit 70 is electrically connected to terminals 16 and 17 via wiring lines 18 and 19. The terminal 16 is electrically connected to the fixed portion 11. The terminal 17 is electrically insulated from the fixed portion 11 via a trench 17a and electrically connected to the movable portion 12 via the semiconductor substrate 2, the second spring portion 30, the first spring portion 20, and the like. The control unit 70 detects capacitance between the fixed portion 11 and the movable portion 12 to drive the electrostatic actuator 10 and applies a drive voltage between the fixed portion 11 and the movable portion 12 on the basis of the detection result. Here, because the movable portion 12, the first spring portion 20, the second spring portion 30, and the movable mirror 5 are integrally formed by the semiconductor layer 9 in the first embodiment, these all have the same potential.

Figure 3:
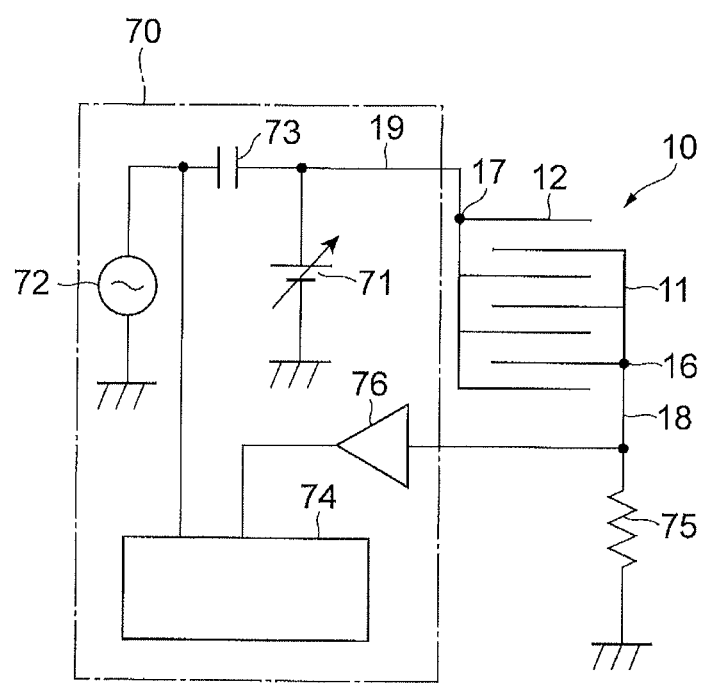
FIG. 3 is a diagram illustrating a circuit configuration of the optical module of FIG. 1.

The control unit 70 will be described in detail with reference to a circuit configuration of the optical module illustrated in FIG. 3. The control unit 70 includes a variable power source 71 for applying a drive voltage between the fixed portion 11 and the movable portion 12, and an alternating current power source 72 configured to output a detection signal for detecting the capacitance between the fixed portion 11 and the movable portion 12. The alternating current power source 72 is electrically connected to the movable portion 12 via a coupling capacitor 73. The control unit 70 applies the drive voltage carrying the detection signal between the fixed portion 11 and the movable portion 12 using the variable power source 71 and the alternating current power source 72. At this time, the fixed portion 11 has a GND level.

The control unit 70 further includes a capacitance detection unit 74. The capacitance detection unit 74 detects a current flowing through a resistance component 75 connected to the fixed portion 11 via an amplifier 76 and measures a change in charge from the detected current. The capacitance detection unit 74 further detects the detection signal output by the alternating current power source 72 and detects the capacitance by measuring a phase difference and an amplitude ratio. Here, a frequency of the detection signal is set to be sufficiently higher than a resonance frequency of the electrostatic actuator 10. Thus, it is possible to detect the capacitance without response of the electrostatic actuator 10 to the detection signal.

The capacitance becomes a function of a distance between the fixed portion 11 and the movable portion 12 because areas of the fixed portion 11 and the movable portion 12 (areas serving as electrodes) are constant. Therefore, the control unit 70 can detect the distance between the fixed portion 11 and the movable portion 12, that is, a movement distance of the movable portion 12 with respect to the fixed portion 11, by detecting the capacitance between the fixed portion 11 and the movable portion 12.

In the optical module 1A configured as described above, when the drive voltage is applied by the control unit 70 between the fixed portion 11 and the movable portion 12 of the electrostatic actuator 10, an electrostatic force is generated according to the drive voltage between the fixed portion 11 and the movable portion 12. Thereby, the movable portion 12 is attracted to the fixed portion 11 in the drive direction A. Because the movable portion 12 is connected to the movable mirror 5 via the first spring portion 20 and the support portions 14 and 15, the movable mirror 5 is driven in parallel to the semiconductor substrate 2 (that is, in a direction parallel to the surface 2a of the semiconductor substrate 2) in conjunction with the movement of the movable portion 12, and the distance between the movable mirror 5 and the fixed mirror 4 is adjusted. Here, because the movable mirror 5 is also connected to the second spring portion 30 having the second spring constant K2 greater than the first spring constant K1 via the support portions 14 and 15, it does not move as much as the movable portion 12. Thus, in the optical module 1A, the movement distance of the movable mirror 5 is reduced with respect to the movement distance of the movable portion 12.

Because a wavelength of light transmitted through the Fabry-Perot interference filter F depends upon the distance between the movable mirror 5 and the fixed mirror 4, it is possible to appropriately select a wavelength of transmitted light by adjusting a drive voltage to be applied to the electrostatic actuator 10. That is, when measurement target light L is incident from outside, light having a wavelength according to the distance between the movable mirror 5 and the fixed mirror 4 is selected and emitted to the outside. At this time, the distance between the movable mirror 5 and the fixed mirror 4 can be adjusted while measuring the capacitance of the electrostatic actuator 10 by the control unit 70 and monitoring the movement distance of the movable portion 12. Because the movement distance of the movable portion 12 is obtained by extending the movement distance of the movable mirror 5 by a predetermined magnification ratio, the control precision of the position of the movable mirror 5 is stable.

Figure 4:
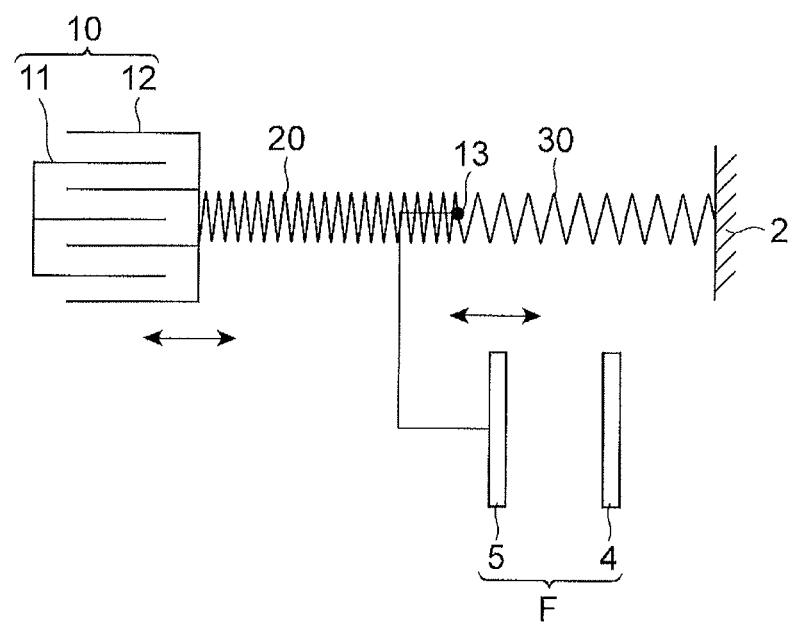
FIG. 4 is a diagram illustrating an operation principle of the optical module of FIG. 1.

An operation principle of the optical module in which the movement distance of the movable mirror 5 is extended will be described with reference to FIG. 4. In the optical module 1A, the first spring constant K1 of the first spring portion 20 and the second spring constant K2 of the second spring portion 30 are set so that K1<K2. When the electrostatic force generated in the electrostatic actuator 10 according to the drive voltage is set to f, the force acting on the first spring portion 20 and the second spring portion 30 also becomes f. Consequently, an elongation x1 of the first spring portion 20 and an elongation x2 of the second spring portion 30 are shown in the following Formulas (1) and (2), respectively. Further, the movement distance x of the movable portion 12 is shown as an elongation sum of the two springs in the following Formula (3).

$$x1 = f/K1 \quad (1)$$

$$x2 = f/K2 \quad (2)$$

$$x = x1 + x2 = f(1/K1 + 1/K2) \quad (3)$$

Here, x2 corresponds to the movement distance of the connection portion 13 between the first spring portion 20 and the second spring portion 30 and is equal to the movement distance of the movable mirror 5. That is, the movable portion 12 is also moved by the elongation of the first spring portion 20 in addition to the movement distance of the movable mirror 5. For example, if the second spring constant K2 is set to be 1000 times the first spring constant K1, the movement distance of the movable portion 12 is extended to 1 μm (exactly, 1.001 μm) when the movement distance of the movable mirror 5 is 1 nm.

Thus, because the movement distance and error of the movable mirror 5 are K1/(K1+K2)≈K1/K2 (in the case of K2>>K1) times the movement distance and error of the movable portion 12 in a state in which the electrostatic force of the electrostatic actuator 10 and the biasing force by the first spring portion 20 and the second spring portion 30 are balanced, the control precision of the position of the movable mirror 5 by the electrostatic actuator 10 is improved and stabilized. Further, because it is only necessary to detect the extended movement distance of the movable portion 12 for detecting the movement distance of the movable mirror 5, the detection precision is improved.

Next, an example of a method of manufacturing the optical module 1A will be described. First, as illustrated in (a) in FIG. 5, a substrate in which the semiconductor layer 9 is formed on the surface 2a of the semiconductor substrate 2 via the insulating layer 8 is prepared as a starting material. For example, an SOI substrate in which an oxide film called a BOX layer is sandwiched between two silicon substrates can be used. Next, an oxide film ($SiO_2$ film) 61 is formed on the semiconductor layer 9. The oxide film 61 functions as a mask for alkali etching. Further, a nitride film (SiN film) 62 and a resist 63 are formed in this order and patterning for DRIB (Deep Reactive Ion Etching) is performed.

Figure 6:
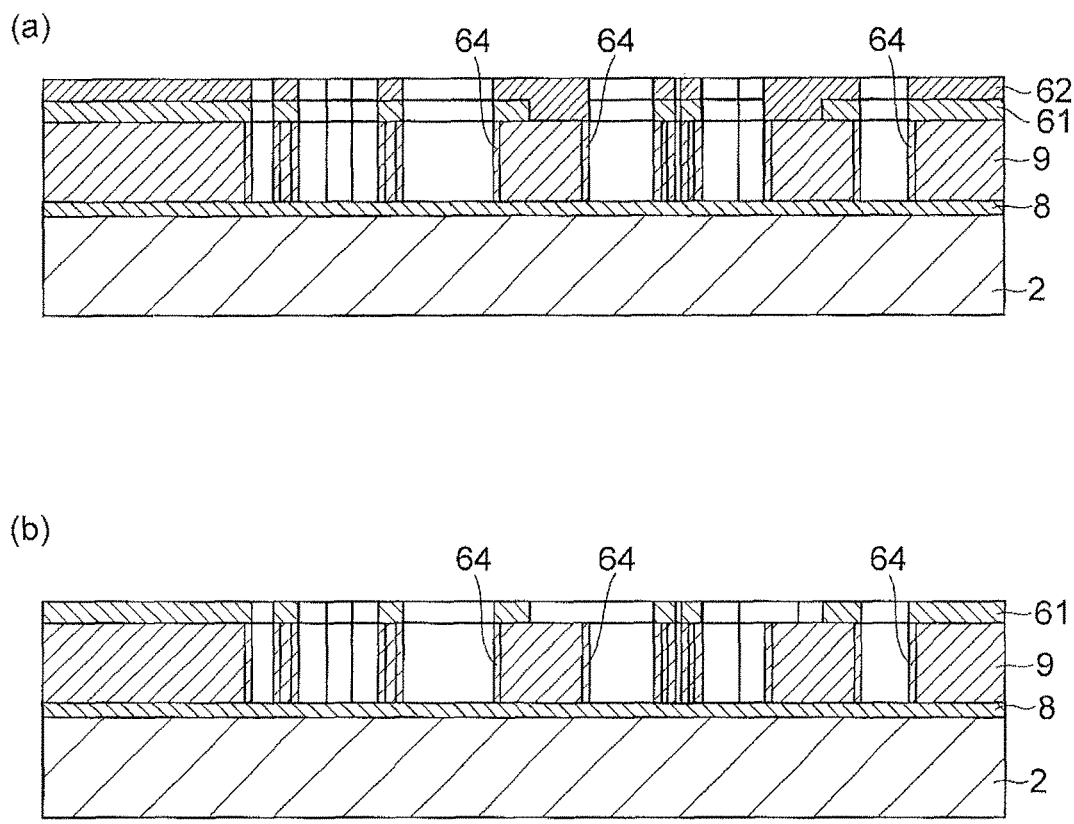
FIG. 6 includes (a), (b) cross-sectional views illustrating a process of manufacturing the optical module of FIG. 1.

Next, as illustrated in (b) in FIG. 5, vertical walls necessary for the electrostatic actuator 10, the input mirror 3, the output mirror 6, etc. are formed by performing the DRIB process and removing a part of the semiconductor layer 9. Next, as illustrated in (a) in FIG. 6, the resist 63 is removed and then an oxide film 64 is formed on a side wall of the vertical wall formed in the DRIB process by performing thermal oxidation. The oxide film 64 functions as a mask for alkali etching. At this time, a surface of silicon facing the side of the nitride film 62 under the nitride film 62 is not oxidized. Next, as illustrated in (b) in FIG. 6, the nitride film 62 is removed by hot phosphoric acid and a part of the semiconductor layer 9 is exposed.

Figure 7:
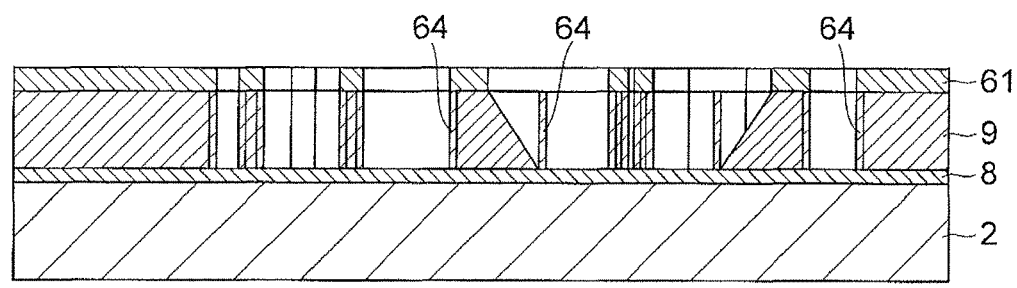
FIG. 7 is a cross-sectional view illustrating a process of manufacturing the optical module of FIG. 1.

Next, as illustrated in FIG. 7, the exposed part of the semiconductor layer 9 is soaked in an alkali liquid and etched and 45° surfaces of the input mirror 3 and the output mirror 6 are formed. Here, because a 90° surface rather than a 45° surface is formed on a surface facing the 45° surface if a crystal orientation is selected so that an opposite side portion of an opening of the 45° surface becomes the 90° surface, the silicon is removed by etching as a result. Finally, the oxide film 61, the oxide film 64, and the insulating layer 8 are removed by hydrofluoric acid. Thus, the optical module 1A illustrated in FIG. 1 is manufactured by bulk micromachining technology. It is not possible to form the 45° surfaces of the input mirror 3 and the output mirror 6 in the same mask process as other components, but there is no problem because it is unnecessary to increase the position precision if the sizes of the input mirror 3 and the output mirror 6 having the 45° surfaces are sufficiently increased for a beam diameter of the measurement target light L.

As described above, the optical module 1A includes the semiconductor substrate 2, the electrostatic actuator 10 including the fixed portion 11 fixed to the semiconductor substrate 2 and the movable portion 12 moved with respect to the fixed portion 11 by an electrostatic force generated between the movable portion 12 and the fixed portion 11, the first spring portion 20 connected to the movable portion 12 and having the first spring constant K1, the second spring portion 30 connected between the first spring portion 20 and the semiconductor substrate 2 and having the second spring constant K2 greater than the first spring constant K1, and the movable mirror 5 which is the optical component connected to the connection portion 13 between the first spring portion 20 and the second spring portion 30.

Thereby, the movement distance of the movable mirror 5 is K1/(K1+K2)≈K1/K2 (in the case of K2>>K1) times the movement distance of the movable portion 12 of the electrostatic actuator 10 moved by the electrostatic force. Thus, the movement distance of the movable mirror 5 becomes small compared to the movement distance of the movable portion 12. Therefore, the control precision of the movable mirror 5 is stable even when the movement distance is small by controlling the movement distance of the movable mirror 5 through control of the movement distance of the movable portion 12 extended by a predetermined magnification ratio.

In general, a relationship between a width W of the gap S between the mirrors in the Fabry-Perot interference filter and a transmission wavelength λ, is expressed by Formula (4), when m is any integer.

$$\lambda = 2W/m \quad (4)$$

According to the above-described Formula (4), the wavelength resolution of the transmission wavelength λ is determined by the control precision of the width W. An arbitrary integer m is set to be large so that the width W can be set to be m times the transmission wavelength λ, serving as a target, and the control precision of the width W can be improved. For example, when m is set to 10, the width W can be set to 10 μm for the transmission wavelength λ, of 1 μm. Here, the wavelength resolution indicates a wavelength unit in which the transmission wavelength λ, in a wavelength variable filter can be set. For example, if the wavelength resolution is 1 nm, it is possible to set the transmission wavelength λ in units of 1 nm.

Further, the Fabry-Perot interference filter has a transmission characteristic even in a high-order wavelength of a selected wavelength and an interval Δλ between the selected wavelength and the high-order transmission wavelength is expressed by Formula (5).

$$\Delta\lambda = \lambda/(m+1) \quad (5)$$

According to the above-described Formula (5), the interval Δλ, from an adjacent high-order transmission wavelength is reduced to a value multiplied by 1/(m+1) by setting an arbitrary integer m to a large value. For example, when in is set to 10, the interval Δλ, from the adjacent high-order transmission wavelength becomes 90 nm and the adjacent high-order transmission wavelength becomes 1.09 μm. That is, light having a wavelength of 1.09 μm is also transmitted.

It is preferable to transmit only light of a selected wavelength in a certain wavelength range as the wavelength variable filter, and it is necessary to design a high-order transmission wavelength which sufficiently deviates from the wavelength range. Therefore, it is necessary to minimize m and it is ideal to set m to 1. However, if that is the case, the width W of the gap S should be controlled at a resolution of half the necessary wavelength resolution. For example, when a wavelength resolution of 1 nm is necessary, the width W should be controlled with the precision of 0.5 nm. This control is not easy even in the electrostatic actuator in which MEMS technology is used and, conventionally, it is necessary to eliminate the instability of the drive voltage, the effect of the ambient temperature, etc. by preparing a calibration curve or the like.

In contrast, in the optical module 1A, the control of the movement distance of the movable mirror 5 can be performed through control of the movement distance of the movable portion 12 of the electrostatic actuator 10 extended as described above. For example, even when the control of the movement distance of the movable mirror 5 should be performed at a precision of 0.5 nm, because the movement distance of the movable portion 12 is extended to 500 nm (exactly, 500.5 nm) if the second spring constant K2 is set to be 1000 times the first spring constant K1, control is facilitated and control precision can be stabilized and improved.

Conventionally, technology for measuring a movement distance by converting a large movement distance of a drive shaft into a small movement distance by fixing the drive shaft to a measurement plate and connecting the measurement plate to a connection portion between two springs having different spring constants so as to detect a position of the drive shaft of a pneumatic operating device such as a cylinder is known (for example, Japanese Examined Utility Model Publication No. H2-40481). However, technology for precisely detecting a small change of an optical component by a spring in an optical module in which MEMS technology is used is not known.

Further, the optical module 1A further includes the control unit 70 for detecting the capacitance between the fixed portion 11 and the movable portion 12 and applying a drive voltage between the fixed portion 11 and the movable portion 12 on the basis of the detection result. Thereby, it is possible to preferably remove an influence of the instability of the drive voltage, the ambient temperature, and the like on the displacement of the movable mirror 5, because it is possible to detect the position of the movable portion 12 of the electrostatic actuator 10 by the capacitance.

An operation is performed in a resonant mode if a high speed which is a feature of MEMS is intended to be utilized, however, in this case, it is not possible to directly control the gap S according to the drive voltage anymore. Further, because an amplitude width in the resonant mode is affected by a feature of an ambient gas (atmospheric pressure) and a filter characteristic changes at each time of use, a measure when the optical module is used while constantly maintaining the temperature within a hermetically sealed package or the like is conventionally imperative. Therefore, conventionally, the position of the movable portion of the electrostatic actuator is detected by the capacitance regardless of the drive voltage. However, for example, when an electrode portion area is 500 μm$^2$, the width W (distance between electrodes) is 1 μm, and m=1, 1 fF should be measured if a precision of 0.5 nm is intended to be obtained for the position of the movable portion. The measurement of this small capacitance is time-consuming and it is difficult to perform monitoring in real time during a resonant operation.

On the other hand, in the optical module 1A, because the movement distance of the movable portion 12 of the electrostatic actuator is extended by a predetermined ratio even when the movement distance of the movable mirror 5 is small, a change in the capacitance is also extended according to this extension and the measurement of the capacitance is facilitated.

Further, it is possible to increase the wavelength resolution of the Fabry-Perot interference filter F by stabilizing and improving the control precision of the position of the movable mirror 5 of the Fabry-Perot interference filter F in the optical module 1A.

Further, in the optical module 1A, the movable portion 12, the first spring portion 20, the second spring portion 30, and the movable mirror 5 are integrally formed with the semiconductor substrate 2. For example, a piezo actuator can precisely perform the control of nanometer order using the piezoelectric effect of a solid material, but it is necessary to assemble a plurality of members to use it as a wavelength variable filter. In contrast, the optical module 1A can monolithically form the movable portion 12, the first spring portion 20, the second spring portion 30, and the movable mirror 5 using the MEMS technology from one plate of the semiconductor layer 9 provided on the semiconductor substrate 2. Thereby, it is possible to simplify the manufacturing process and reduce the manufacturing cost.

Further, in the optical module 1A, the first spring portion 20 has two first springs 21 and 22 provided in parallel and the second spring portion 30 has two second springs 31 and 32 provided in parallel. Thus, for example, the support of the movable portion 12 and, the movable mirror 5 is stabilized even when any spring is damaged.

Further, in the optical module 1A, the movable mirror 5 is moved in parallel to the semiconductor substrate 2. Further, the first spring portion 20 and the second spring portion 30 expand and contract in parallel to the semiconductor substrate 2. According to this configuration, it is possible to easily extend the movable range of the movable portion 12 connected to the first spring portion 20 and the second spring portion 30 by appropriately extending the size of the semiconductor substrate 2. Therefore, the movement distance of the movable portion 12 is likely to increase and it is possible to more stably perform the operation of the movable mirror 5 with high precision. Further, it is possible to preferably apply a manufacturing method using surface micromachining technology.

Further, in the optical module 1A, the first spring portion 20 has one end 20a to which the movable portion 12 is fixed and the other end 20b serving as the connection portion 13 with the second spring portion 30, and the second spring portion 30 has one end 30a serving as the connection portion 13 with the first spring portion 20 and the other end 30b fixed to the semiconductor substrate 2. According to this configuration, the movement distance of the movable portion 12 is likely to increase because the elongation of the entire first spring portion 20 can be set as the movement distance of the movable portion 12. Therefore, it is possible to more stably perform an operation of the movable mirror 5 with high precision.

Second Embodiment

Figure 8:
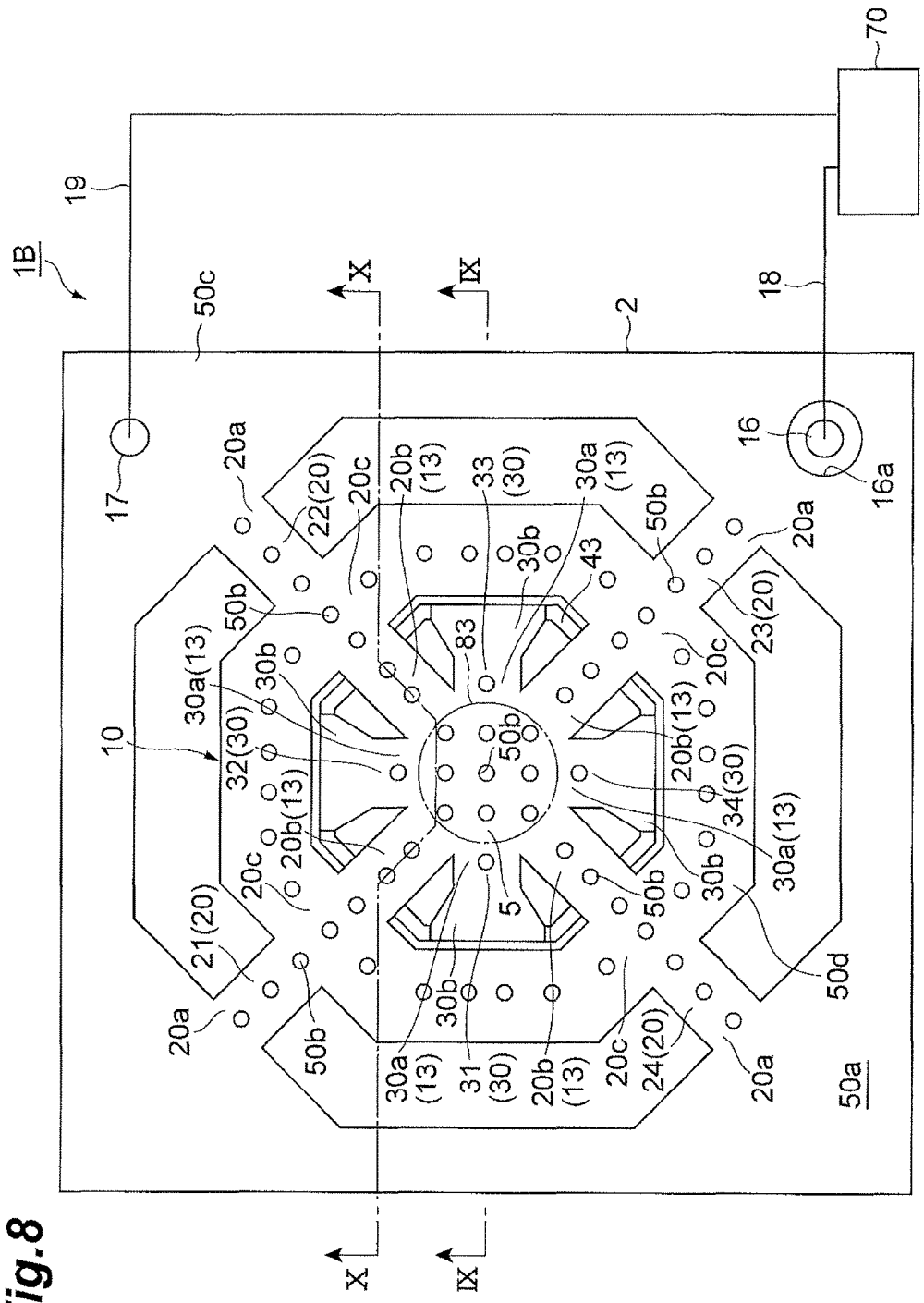
FIG. 8 is a plan view of an optical module of a second embodiment.
Figure 9:
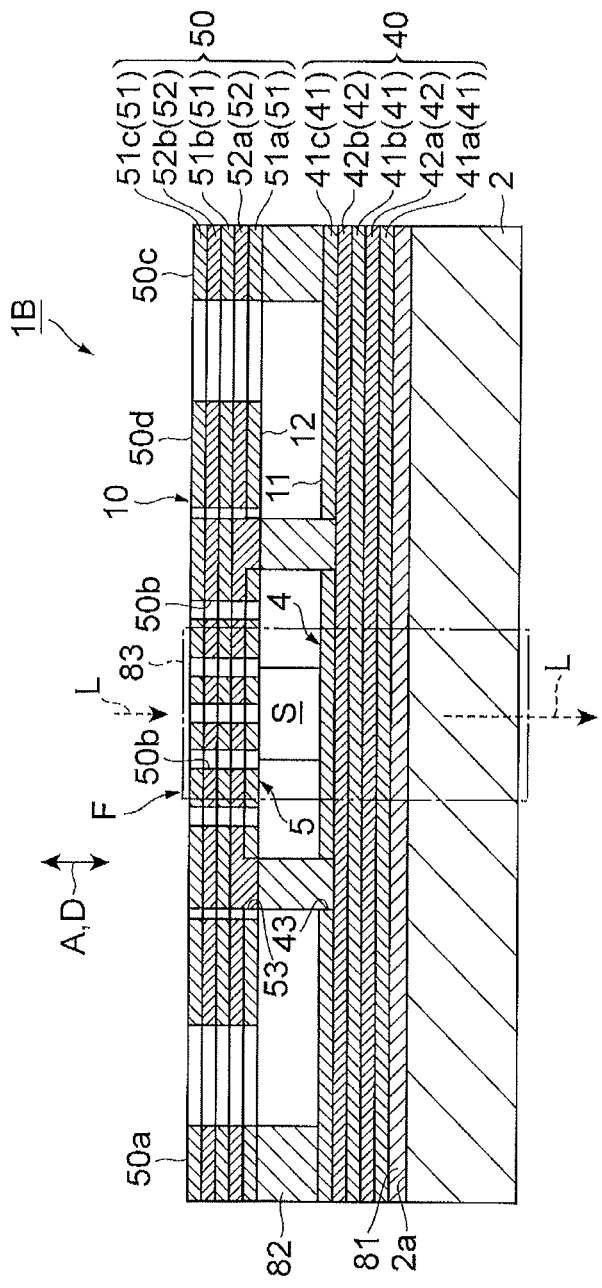
FIG. 9 is a cross-sectional view taken along line IX-IX of the optical module of FIG. 8.
Figure 10:
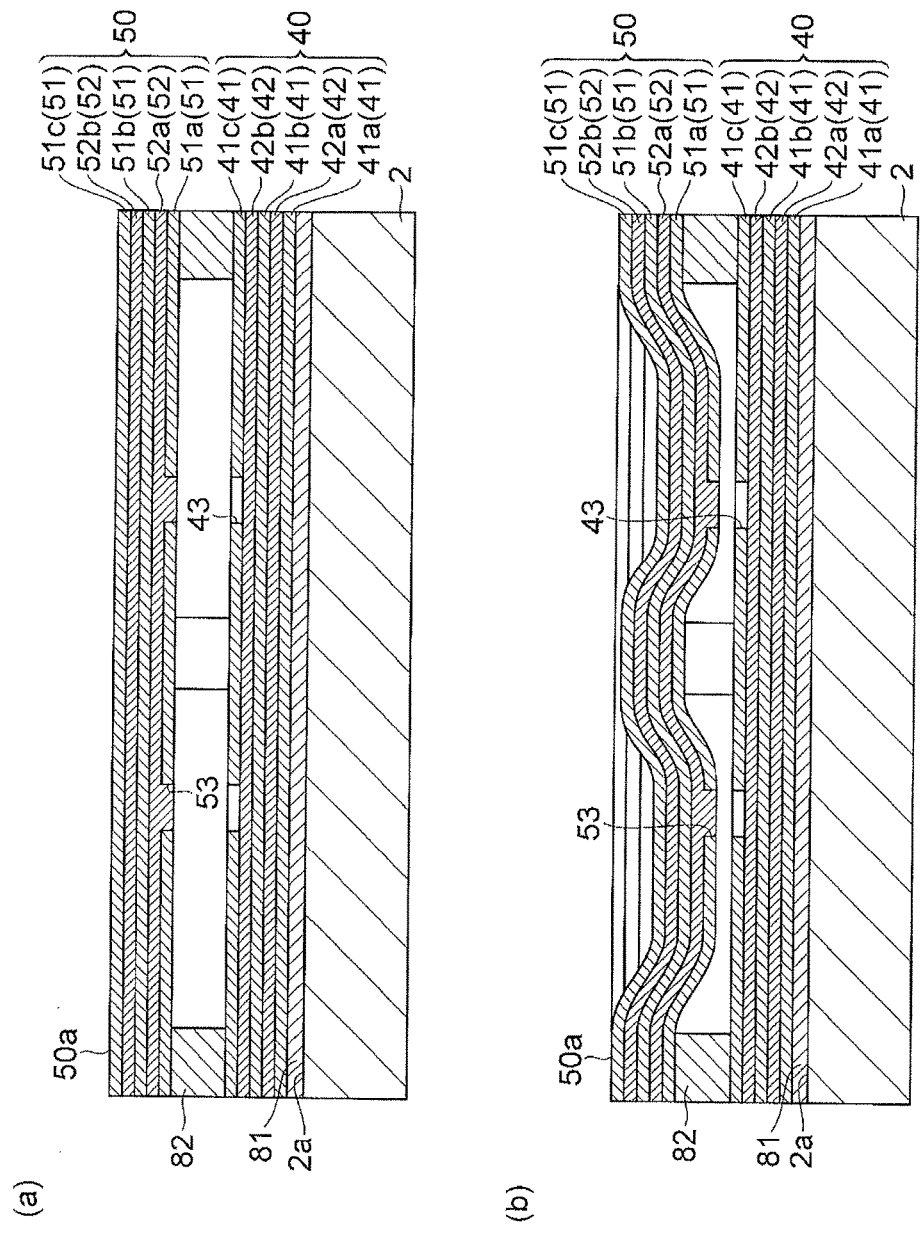
FIG. 10 includes (a), (b) cross-sectional views taken along line X-X of the optical module of FIG. 8.

FIG. 8 is a plan view of an optical module of the second embodiment. FIG. 9 is a cross-sectional view taken along line IX-IX of the optical module of FIG. 8. FIG. 10 includes cross-sectional views taken along line X-X of the optical module of FIG. 8.

As illustrated in FIG. 8 and FIG. 9, an optical module 1B includes a semiconductor substrate 2. An oxide film 81, a first laminate 40, an intermediate layer 82, and a second laminate 50 are laminated in this order on the semiconductor substrate 2, and a Fabry-Perot interference filter F is configured as an MEMS device. In the second embodiment, the semiconductor substrate 2 is made of silicon (Si) and formed in a rectangular plate shape. Further, the oxide film 81 is made of silicon oxide ($SiO_2$), and the intermediate layer 82 is, for example, made of silicon oxide ($SiO_2$).

Between the first laminate 40 and the second laminate 50, a gap S is formed by the intermediate layer 82 formed in a rectangular frame shape along an outer edge of the semiconductor substrate 2. In a light transmission region 83 defined at the central portion, the Fabry-Perot interference filter F transmits light having a wavelength according to a distance between the first laminate 40 and the second laminate 50 among measurement target light L incident from an opposite side of the semiconductor substrate 2 and emits the light to a side of the semiconductor substrate 2. Here, a thickness of the intermediate layer 82 is, for example, 200 nm to 10 μm. Because an optical thickness of the intermediate layer 82 corresponds to the distance between the first laminate 40 and the second laminate 50, it is preferable that the optical thickness be an integer multiple of ½ of a center transmission wavelength (that is, a wavelength at the center of a variable range of a wavelength transmitted by the Fabry-Perot interference filter F).

The first laminate 40 is configured by alternately laminating a plurality of polysilicon layers 41 and a plurality of silicon nitride layers 42 one by one. In the second embodiment, a polysilicon layer 41a, a silicon nitride layer 42a, a polysilicon layer 41b, a silicon nitride layer 42b, and a polysilicon layer 41c are laminated on the oxide film 81 in this order. A part corresponding to the light transmission region 83 in the first laminate 40 functions as a fixed mirror 4.

The fixed mirror 4 of the second embodiment becomes a Bragg mirror in which three polysilicon layers 41 and two silicon nitride layers 42 are alternately laminated. The polysilicon layer 41 is obtained by poly-crystallizing amorphous silicon through annealing. A thickness of each of the layers 41 and 42 is 50 nm to 2 μm. In the second embodiment, the thickness of each polysilicon layer 41 is 130 nm and the thickness of each silicon nitride layer 42 is 200 nm. Here, it is preferable that the optical thickness of each of the polysilicon layer 41 and the silicon nitride layer 42 constituting the fixed mirror 4 be an integer multiple of ¼ of the center transmission wavelength.

An outer edge portion surrounding the light transmission region 83 in the polysilicon layer 41c constituting the first laminate 40 functions as the fixed portion 11 of the electrostatic actuator 10. The fixed portion 11 is electrically insulated from a region of an inner side including the light transmission region 83 by a trench 43 annularly extending along an inner edge of the fixed portion. Here, the intermediate layer 82 remains in a part of the trench 43.

Similar to the first laminate 40, the second laminate 50 is configured by alternately laminating a plurality of polysilicon layers 51 and a plurality of silicon nitride layers 52 one by one. In the second embodiment, a polysilicon layer 51a, a silicon nitride layer 52a, a polysilicon layer 51b, a silicon nitride layer 52b, and a polysilicon layer 51c are laminated on the intermediate layer 82 in this order. The second laminate 50 is partially etched and removed and therefore the remaining part without being etched has a predetermined shape. A part corresponding to the light transmission region 83 in the second laminate 50 functions as a movable mirror (an optical component) 5 opposite to the fixed mirror 4 through the gap S.

The movable mirror 5 of the second embodiment becomes a Bragg mirror in which three polysilicon layers 51 and two silicon nitride layers 52 are alternately laminated. The polysilicon layer 51 is obtained by poly-crystallizing amorphous silicon through annealing. A thickness of each of the layers 51 and 52 is 50 nm to 2 μm. In the second embodiment, the thickness of the polysilicon layer 51 is 130 nm and the thickness of each silicon nitride layer 52 is 200 nm. Here, it is preferable that the optical thickness of each of the polysilicon layer 51 and the silicon nitride layer 52 constituting the movable mirror 5 be an integer multiple of ¼ of the center transmission wavelength.

A multi-layer film of the Bragg mirror constituting the fixed mirror 4 and the movable mirror 5 may not necessarily be a combination of polysilicon layers and silicon nitride layers as long as the layers are transparent to a target wavelength and have different refractive indexes. However, because the layer in contact with the side of the gap S (the polysilicon layer 41c and the polysilicon layer 51a in the second embodiment) also serves as an electrode, it is necessary to set the layer to a highly conductive film. Further, because the necessary number of layers for increasing reflectance increases when a refractive index difference is small, it is preferable to select a combination of layers between which a refractive index difference is large.

A part of an outer side of the light transmission region 83 of the second laminate 50 further includes parts which function as the first spring portion 20, the second spring portion 30, and the movable portion 12 of the electrostatic actuator 10. In the second laminate 50, a plurality of through-holes 50b ranging from the surface 50a of the second laminate 50 to the gap S are uniformly distributed. The through-holes 50b are formed to an extent to which the function of the movable mirror 5 is not substantially affected. A diameter of the through-hole 50b is 100 nm to 5 μm and an opening area of the through-hole 50b occupies 0.01 to 10% of the area of the movable mirror 5.

The first spring portion 20 is constituted of a part of the second laminate 50 and is displaceable in a direction vertical to the semiconductor substrate 2. The first spring portion 20 includes four first springs 21 to 24 radially provided in parallel around the movable mirror 5 as a center.

The first spring portion 20 has four one ends 20a (that is, one ends of the first springs 21 to 24) fixed to an outer edge portion 50c provided on the frame-shaped intermediate layer 82 in the second laminate 50. Further, the first spring portion 20 has four other ends 20b (that is, the other ends of the first springs 21 to 24) serving as the connection portion 13 with the second spring portion 30. Further, the first spring portion 20 has four intermediate portions 20c (that is, intermediate portions of the first springs 21 to 24) connected to the movable portion 12. The first spring portion 20 has the first spring constant K1. Here, the first spring constant K1 indicates the ease of displacement in a direction vertical to the semiconductor substrate 2 in the intermediate portion 20c of the first spring portion 20. Further, the first spring constant K1 is obtained by combining spring constants of the four first springs 21 to 24.

The second spring portion 30 is constituted of a part of the second laminate 50 and is displaceable in the direction vertical to the semiconductor substrate 2. The second spring portion 30 includes four second springs 31 to 34 radially provided in parallel around the movable mirror 5 as a center. The second springs 31 to 34 are provided alternately with the first springs 21 to 24 around the movable mirror 5.

The second spring portion 30 has four one ends 30a (that is, one ends of the second springs 31 to 34) serving as the connection portion 13 with the first spring portion 20. Further, the second spring portion 30 has four other ends 30b (that is, the other ends of the second springs 31 to 34) fixed to the semiconductor substrate 2 via the intermediate layer 82 and the like remaining in the trench 43. The second spring portion 30 has the second spring constant K2 greater than the first spring constant K1. Here, the second spring constant K2 indicates the ease of displacement in a direction vertical to the semiconductor substrate 2 at one end 30a of the second spring portion 30. Further, the second spring constant K2 is obtained by combining the spring constants of the four second springs 31 to 34. Here, in the second embodiment, theoretically, the four connection portions 13 between the first springs 21 to 24 and the second springs 31 to 34 overlap respectively at the center of the movable mirror 5.

The polysilicon layer 51a constituting a part corresponding to an annular portion 50d surrounding the movable mirror 5 and the second spring portion 30 in the second laminate 50 functions as the movable portion 12. The movable portion 12 is electrically insulated from a region of an inner side including the light transmission region 83 by a trench 53 provided in the polysilicon layer 51a along an inner edge of the movable portion.

Here, although the trench 53 is provided in all parts opposite to the trench 43 in an opposing direction D in the polysilicon layer 51a in the second embodiment, it is possible to electrically insulate the movable portion 12 from the region of the inner side including the light transmission region 83 if the trench 53 is provided in at least a part of the first spring portion 20. The silicon nitride layer 52a is embedded in the trench 53. The annular portion 50d and the movable portion 12 included in the annular portion 50d are connected to the intermediate portion 20c of the first spring portion 20 and supported.

The optical module 1B further includes a control unit 70. The control unit 70 is electrically connected to terminals 16 and 17 via wiring lines 18 and 19. The terminal 16 is electrically insulated from the movable portion 12 (that is, the polysilicon layer 51a of the second laminate 50) via the trench 16a, and is electrically connected to the fixed portion 11 (that is, the polysilicon layer 41c of the first laminate 40). The terminal 17 is electrically connected to the movable portion 12 (that is, the polysilicon layer 51a of the second laminate 50). As in the above-described first embodiment, the control unit 70 detects capacitance between the fixed portion 11 and the movable portion 12 to drive the electrostatic actuator 10 and applies a drive voltage between the fixed portion 11 and the movable portion 12 on the basis of the detection result.

In the optical module 1B configured as described above, an electrostatic force according to the drive voltage is generated between the fixed portion 11 and the movable portion 12 when the control unit 70 applies the drive voltage between the fixed portion 11 and the movable portion 12 of the electrostatic actuator 10, in a state illustrated in (a) in FIG. 10. Thereby, as illustrated in (b) in FIG. 10, the movable portion 12 is attracted to the fixed portion 11 in a drive direction A (a direction vertical to the surface 2a of the semiconductor substrate 2).

Here, in the second embodiment, the drive direction A matches the opposing direction D in which the fixed mirror 4 and the movable mirror 5 are opposite. Because the movable portion 12 is connected to the movable mirror 5 via the first spring portion 20, the movable mirror 5 is driven vertically to the semiconductor substrate 2 (that is, in the direction vertical to the surface 2a of the semiconductor substrate 2) in conjunction with the movement of the movable portion 12, and the distance between the movable mirror 5 and the fixed mirror 4 is adjusted. Here, because the movable mirror 5 is also connected to the second spring portion 30 having the second spring constant K2 greater than the first spring constant K1, the movable mirror does not move as much as the movable portion 12. Thus, in the optical module 1B, the movement distance of the movable mirror 5 is reduced with respect to the movement distance of the movable portion 12.

Because a wavelength of light transmitted through the Fabry-Perot interference filter F depends upon the distance between the movable mirror 5 and the fixed mirror 4, it is possible to appropriately select the wavelength of the light to be transmitted by adjusting the drive voltage to be applied to the electrostatic actuator 10. That is, when measurement target light L is incident from outside, light having a wavelength according to the distance between the movable mirror 5 and the fixed mirror 4 is selected and emitted to the outside. At this time, the distance between the movable mirror 5 and the fixed mirror 4 can be adjusted while measuring the capacitance of the electrostatic actuator 10 by the control unit 70 and monitoring the movement distance of the movable portion 12. Because the movement distance of the movable portion 12 is obtained by extending the movement distance of the movable mirror 5 by a predetermined magnification ratio, the control precision of the position of the movable mirror 5 is stable.

Figure 11:
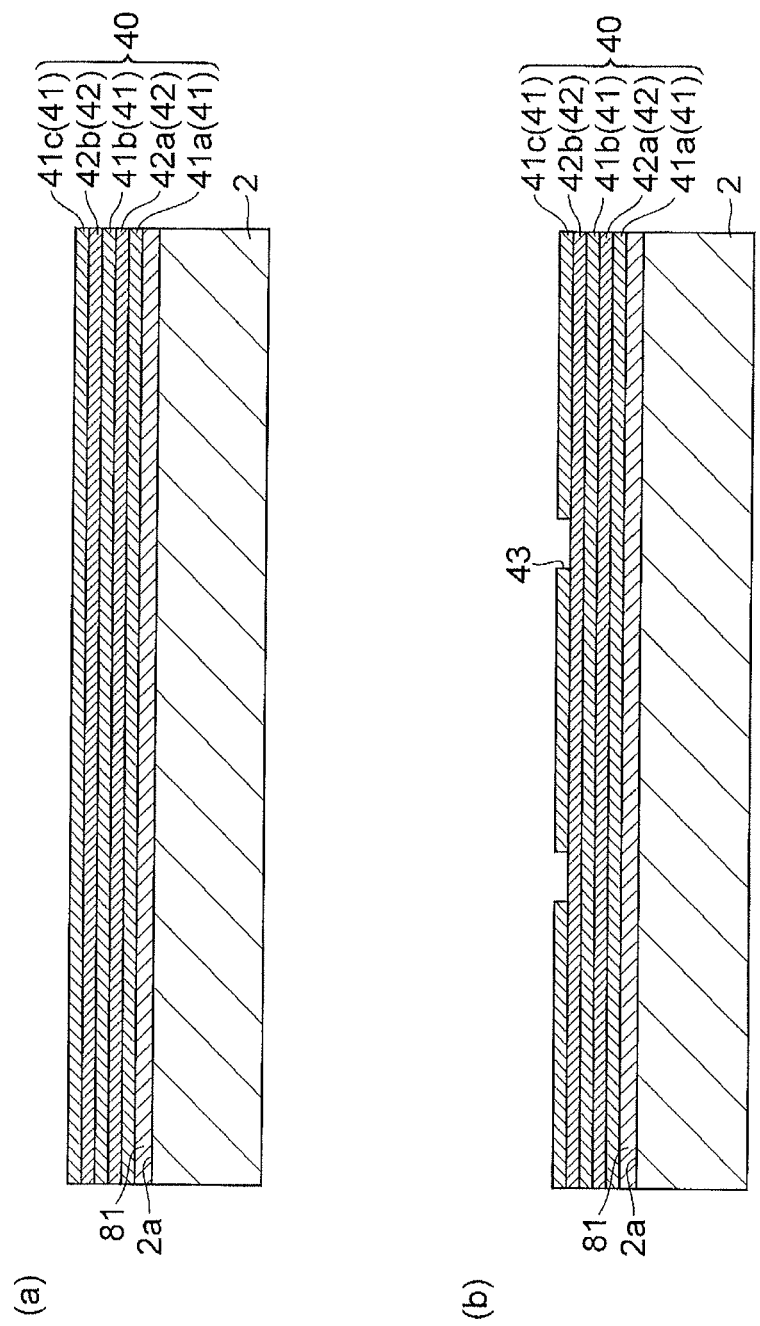
FIG. 11 includes (a), (b) cross-sectional views illustrating a process of manufacturing the optical module of FIG. 8.
Figure 12:
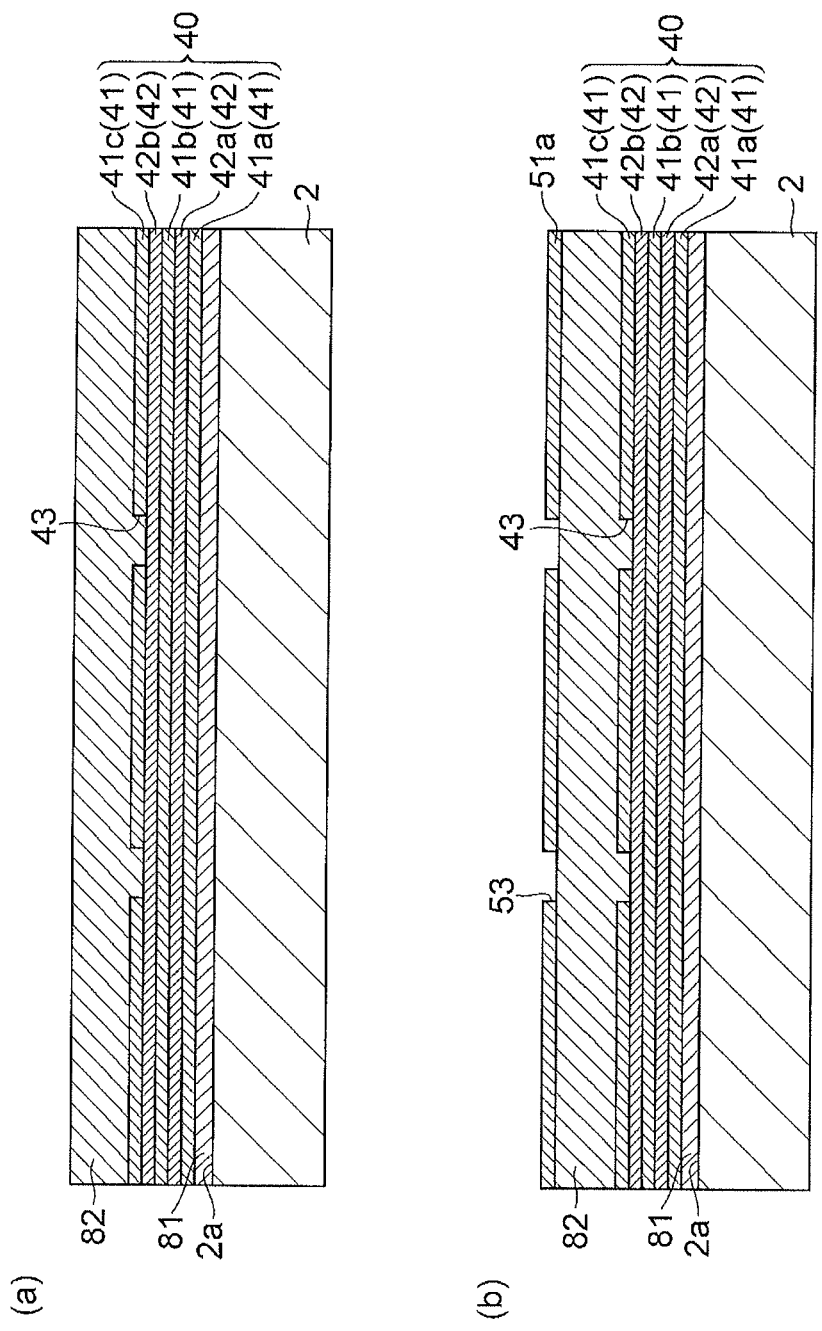
FIG. 12 includes (a), (b) cross-sectional views illustrating a process of manufacturing the optical module of FIG. 8.

Next, an example of a method of manufacturing the optical module 1B will be described. First, as illustrated in (a) in FIG. 11, the oxide film 81 and the first laminate 40 are formed in this order on the semiconductor substrate 2. Next, as illustrated in (b) in FIG. 11, the polysilicon layer 41c of the first laminate 40 is patterned and the trench 43 is formed. Next, as illustrated in (a) in FIG. 12, an oxide film serving as the intermediate layer 82 is formed as a sacrificial layer. Next, as illustrated in (b) in FIG. 12, the polysilicon layer 51a of the second laminate 50 is formed. Next, the polysilicon layer 51a is patterned and the trench 53 is formed.

Next, as illustrated in (a) in FIG. 13, the remaining layers of the second laminate 50 are formed. Next, as illustrated in (b) in FIG. 13, the second laminate 50 is partially dry-etched and removed, and the parts such as the movable mirror 5, the first spring portion 20, the second spring portion 30, and the movable portion 12 of the electrostatic actuator 10 are formed, and the through-holes 50b are formed. Further, contact holes for the fixed portion 11 and the movable portion 12 corresponding to the terminals 16 and 17 are formed and a film of an electrode metal is formed. Next, gas phase etching is performed via the through-holes 50b using a hydrofluoric acid gas, the intermediate layer 82 is partially removed, and the gap S is formed.

Thus, the optical module 1B illustrated in FIG. 8 is manufactured by the surface micromachining technology. Here, no through-holes 50b are formed in parts serving as ends 30b of the second spring portion 30 and the outer edge portion 50c, so that adjustment can be performed so that the intermediate layer 82 remains.

Although the lengths of the first spring portion 20 and the second spring portion 30 are adjusted to adjust magnitudes of the first spring constant K1 and the second spring constant K2 in the second embodiment, for example, the magnitudes of the first spring constant K1 and the second spring constant K2 may be adjusted by depositing the electrode metal on the second spring portion 30, when the terminals 16 and 17 are formed. Further, it is possible to adjust the magnitudes of the first spring constant K1 and the second spring constant K2 by changing the materials and configurations of layers of the first spring portion 20 and the second spring portion 30 such as etching the polysilicon layer 51 of the first spring portion 20 to set a state in which only the silicon nitride layer 52 remains.

The movable mirror 5 is driven vertically to the semiconductor substrate 2 in the optical module 1B as described above. Thereby, it is easy to cause the measurement target light L to be incident on the movable mirror 5, for example, because the movable mirror 5 is exposed outside the optical module 1B. Further, it is possible to preferably apply the manufacturing method using the surface micromachining technology.

Further, in the optical module 1B, the first spring portion 20 has one end 20a fixed to the semiconductor substrate 2 and the other end 20b serving as the connection portion 13 with the second spring portion 30, the second spring portion 30 has one end 30a serving as the connection portion 13 and the other end 30b fixed to the semiconductor substrate 2, and the movable portion 12 is connected to the intermediate portion 20c of the first spring portion 20. Thereby, because one end of the first spring portion 20 is fixed to the semiconductor substrate 2, the first spring portion 20 is unlikely to be damaged.

Although the embodiment of the present invention has been described above, the present invention is not limited to the above-described embodiment. For example, the detection of the position of the movable portion is not performed by detection of capacitance between the fixed portion and the movable portion, but may be performed according to displacement measurement by a laser interferometer or the like. Thereby, the detection of the capacitance is unnecessary.

Further, for example, the optical component may be a member such as a mirror constituting an interference filter other than the Fabry-Perot interference filter. Thereby, it is possible to increase the wavelength resolution of the interference filter by stably operating the member with high precision. Further, for example, in the second embodiment, one end 20a of the first spring portion 20 may not be fixed to the semiconductor substrate 2, and the one end 20a may be connected to the movable portion 12 to support the movable portion 12. Thereby, the elongation of the entire first spring portion 20 can be set as the movement distance of the movable portion 12 and the movement distance of the movable portion 12 is likely to extend.

The optical module according to the above-described embodiment is configured to include a semiconductor substrate; an electrostatic actuator including a fixed portion fixed to the semiconductor substrate and a movable portion moved with respect to the fixed portion by an electrostatic force generated between the movable portion and the fixed portion; a first spring portion connected to the movable portion and having a first spring constant; a second spring portion connected between the first spring portion and the semiconductor substrate and having a second spring constant greater than the first spring constant; and an optical component connected to a connection portion between the first spring portion and the second spring portion.

The optical module of the above-described configuration may be configured to further include a control unit configured to detect capacitance between the fixed portion and the movable portion and apply a drive voltage between the fixed portion and the movable portion on the basis of the detection result. Thereby, because the position of the movable portion of the electrostatic actuator can be detected by the capacitance, it is possible to appropriately operate the optical component regardless of instability of the drive voltage, a change in an ambient temperature, and the like.

In the optical module of the above-described configuration, the optical component may be configured to be a movable mirror of a Fabry-Perot interference filter. It is possible to improve the wavelength resolution of the Fabry-Perot interference filter by stably operating the movable mirror with high precision.

In the optical module of the above-described configuration, the movable portion, the first spring portion, the second spring portion, and the optical component may be configured to be integrally formed with the semiconductor substrate. Thereby, for example, it is possible to simplify a manufacturing process because the movable portion, the first spring portion, the second spring portion, and the optical component can be formed at one time by etching the semiconductor layer provided on the semiconductor substrate.

In the optical module of the above-described configuration, the first spring portion may be configured to include a plurality of first springs provided in parallel, and the second spring portion may be configured to include a plurality of second springs provided in parallel. Thereby, because each of the first spring portion and the second spring portion includes a plurality of springs, the support of the movable portion and the optical component is likely to be stabilized.

In the optical module of the above-described configuration, the optical component may be a component to be driven in parallel to the semiconductor substrate. Thereby, a movable range of the movable portion is likely to extend.

In the optical module of the above-described configuration, the first spring portion may be configured to have one end to which the movable portion is fixed and the other end serving as the connection portion, and the second spring portion may be configured to have one end serving as the connection portion and the other end fixed to the semiconductor substrate. Thereby, because the elongation of the entire first spring portion can be set as the movement distance of the movable portion, the movement distance of the movable portion 12 is likely to extend.

In the optical module of the above-described configuration, the optical component may be configured to be driven vertically to the semiconductor substrate. Thereby, for example, measurement target light is likely to be incident even when the optical component is the movable mirror of the Fabry-Perot interference filter.

In the optical module of the above-described configuration, the first spring portion may be configured to have one end fixed to the semiconductor substrate and the other end serving as the connection portion, the second spring portion may be configured to have one end serving as the connection portion and the other end fixed to the semiconductor substrate, and the movable portion may be configured to be connected to an intermediate portion of the first spring portion. Accordingly, because the one end of the first spring portion is fixed to the semiconductor substrate, the first spring portion is unlikely to be damaged.

INDUSTRIAL APPLICABILITY

The present invention may be used as an optical module capable of stably operating an optical component with high precision using an electrostatic actuator.

REFERENCE SIGNS LIST 1A, 1B—optical module, 2—semiconductor substrate, 3—input mirror, 4—fixed mirror, 5—movable mirror (optical component), 6—output mirror, 8—insulating layer, 9—semiconductor layer, 10—electrostatic actuator, 11—fixed portion, 12—movable portion, 13—connection portion, 14, 15—support portion, 16, 17—terminal, 18, 19—wiring line, 20—first spring portion, 20a—one end, 20b—other end, 20c—intermediate portion, 21, 22, 23, 24—first spring, 30—second spring portion, 30a—one end, 30b—other end, 31, 32, 33, 34—second spring, 40—first laminate, 50—second laminate, 81—oxide film, 82—intermediate layer, 70—control unit, F—Fabry-Perot interference filter, L—measurement target light, S—gap.

The invention claimed is:

1. An optical module comprising:
   a semiconductor substrate;
   an electrostatic actuator including a fixed portion fixed to the semiconductor substrate and a movable portion moved with respect to the fixed portion by an electrostatic force generated between the movable portion and the fixed portion;
   a first spring portion connected to the movable portion and having a first spring constant;
   a second spring portion connected between the first spring portion and the semiconductor substrate and having a second spring constant greater than the first spring constant; and
   a movable mirror of a Fabry-Perot interference filter connected between the first spring portion and the second spring portion.

2. The optical module according to claim 1, further comprising a control unit detecting a capacitance between the fixed portion and the movable portion and applying a drive voltage between the fixed portion and the movable portion on the basis of the detection result.

3. The optical module according to claim 1, wherein the movable portion, the first spring portion, the second spring portion, and the movable mirror are integrally formed with the semiconductor substrate.

4. The optical module according to claim 1, wherein
   the first spring portion includes a plurality of first springs provided in parallel, and
   the second spring portion includes a plurality of second springs provided in parallel.

5. The optical module according to claim 1, wherein the movable mirror is driven in parallel to the semiconductor substrate.

6. The optical module according to claim 5, wherein
   the first spring portion has one end to which the movable portion is fixed and the other end serving as a connection portion connected to the movable mirror, and
   the second spring portion has one end serving as the connection portion and the other end fixed to the semiconductor substrate.

7. The optical module according to claim 1, wherein the movable mirror is driven vertically to the semiconductor substrate.

8. The optical module according to claim 7, wherein
   the first spring portion has one end fixed to the semiconductor substrate and the other end serving as a connection portion connected to the movable mirror,
   the second spring portion has one end serving as the connection portion and the other end fixed to the semiconductor substrate, and
   the movable portion is connected to an intermediate portion of the first spring portion.

* * * * *